United States Patent
Bude et al.

(10) Patent No.: US 7,262,476 B2
(45) Date of Patent: Aug. 28, 2007

(54) SEMICONDUCTOR DEVICE HAVING IMPROVED POWER DENSITY

(75) Inventors: Jeff D. Bude, New Providence, NJ (US); Isik C. Kizilyalli, Allentown, PA (US); Kent Smith, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 254 days.

(21) Appl. No.: 10/999,704

(22) Filed: Nov. 30, 2004

(65) Prior Publication Data

US 2006/0113625 A1 Jun. 1, 2006

(51) Int. Cl.
*H01L 29/76* (2006.01)
(52) U.S. Cl. .................. 257/493; 257/341
(58) Field of Classification Search ........ 257/341–345, 257/492, 493, 496
See application file for complete search history.

(56) References Cited

U.S. PATENT DOCUMENTS

| | | | | |
|---|---|---|---|---|
| 5,086,332 | A * | 2/1992 | Nakagawa et al. | 257/538 |
| 6,608,351 | B1 * | 8/2003 | Meeuwsen et al. | 257/343 |
| 2002/0185679 | A1 | 12/2002 | Baliga | |
| 2003/0228737 | A1 * | 12/2003 | Efland et al. | 438/382 |

FOREIGN PATENT DOCUMENTS

DE 10311699 A1 * 11/2004

OTHER PUBLICATIONS

Translation of Taddiken DE 10311699.*

S. Xu et al., "High Power Silicon RF LDMOSFET Technology for 2.1GHz Power Amplifier Applications," Proceedings ISPSD 2003, Apr. 14-17, 2003, pp. 190-193.

A. Ludikhuize, "A Review of RESURF Technology," Proceedings of IEEE ISPSD 2000, May 22-25, 2000, France, pp. 11-18.

M. Amato et al., "Comparison of Lateral and Vertical DMOS Specific On-Resistance," Proceedings of IEEE IEDM 1985, pp. 736-739.

E.H. Stupp et al., "Low Specific On-Resistance 400V LDMOST," Proceedings of IEEE IEDM 1981, pp. 426-428.

(Continued)

*Primary Examiner*—Thomas L. Dickey

(57) ABSTRACT

An MOS device is formed including a semiconductor layer of a first conductivity type, and source and drain regions of a second conductivity type formed in the semiconductor layer proximate an upper surface of the semiconductor layer. The source and drain regions are spaced apart relative to one another. A drift region of the second conductivity type is formed in the semiconductor layer proximate the upper surface of the semiconductor layer and at least partially between the source and drain regions, the drift region having an impurity doping concentration greater than about $2.0e12$ atoms/cm$^2$. An insulating layer is formed on at least a portion of the upper surface of the semiconductor layer. The device further includes a gate formed on the insulating layer at least partially between the source and drain regions, and a buried layer of the first conductivity type formed in the semiconductor layer in close relative proximity to and beneath at least a portion of the drift region. A substantially vertical distance between the buried layer and the drift region, and/or one or more physical dimensions of the buried layer are configured so as to optimize a power density of the device relative to at least one of an on-resistance and a maximum drain current of the device.

20 Claims, 4 Drawing Sheets

OTHER PUBLICATIONS

J. Olsson et al., "1 W/mm RF Power Density at 3.2 GHz for a Dual-Layer RESURF LDMOS Transistor," IEEE Electron Device Letters, vol. 23, No. 4, Apr. 2002, pp. 206-208.

H. Brech et al., "Voltage Optimization for State of the Art RF-LDMOS for 2.1 GHz W-CDMA Cellular Infrastructure Applications," Proceedings of IEEE MTT-S Digest 2003, pp. 209-212.

M. Shindo et al., "High Power LDMOS for Cellular Base Station Applications," Proceedings of IEEE ISPSD 2001, pp. 107-110.

S. Manzini et al., "Hot-Electron-Induced Degradation in High-Voltage Submicron DMOS Transistors," Proc. IEEE ISPSD, 1996, pp. 65-68.

* cited by examiner

SEMICONDUCTOR DEVICE HAVING IMPROVED POWER DENSITY

FIELD OF THE INVENTION

The present invention relates generally to semiconductor devices, and more particularly relates to techniques for achieving increased power density in a semiconductor device without significantly increasing hot carrier injection (HCI) and/or decreasing breakdown voltage in the device.

BACKGROUND OF THE INVENTION

Power semiconductor devices, including lateral diffused metal-oxide semiconductor (LDMOS) devices, are employed in a wide variety of applications, such as, for example, power amplification and switching. Although these power devices can achieve high efficiency, linearity and power gain with sufficient reliability when biased at relatively high drain bias voltages (e.g., up to about 30 volts), it is desirable to increase a power density (PDEN) in theses devices. Increased power density generally results in smaller device areas, which translates into lower cost per watt. Furthermore, increasing the power density without also increasing parasitic capacitances and inductances per unit device width typically results in lower overall parasitics for the same output power, which is critical for matching, power gain and efficiency. LDMOS devices, when employed as high-speed, high-voltage switches, for example, generally require a substantially low on-resistance (e.g., less than a few ohms). Power density and on-resistance (Ron) are related in that both characteristics require a device having a drain structure that can support a high current density (e.g., about several milliamperes (mA)).

There exists a trade-off in conventional power semiconductor devices between on-resistance and breakdown voltage (VBD), as discussed, for example, in a paper by M. Amato, entitled "Comparison of Lateral and Vertical DMOS Specific On-resistance," *Proceedings of IEEE IEDM*, pp. 736-739 (1985), the disclosure of which is incorporated by reference herein. The relationship between the breakdown voltage of a given device and the on-resistance multiplied by the area of the device (Ron×A) is typically used as an efficiency metric for gauging the electrical performance characteristics of power transistors.

Many high performance power devices employ a reduced surface field (RESURF) principle to some extent in order to improve a tradeoff between increased HCI degradation and decreased breakdown voltage (see, e.g., A. Ludikhuize, "A Review of RESURF Technology," *Proceedings of IEEE ISPSD*, pp. 11-18, May 2000, the disclosure of which is incorporated by reference herein). RESURF is a well-known technique employed in the design of high voltage, low on-resistance devices. In lateral power devices in which drain current (ID) flows predominantly along a silicon surface of the device, a lateral field is created in a drift region of the device which acts in the direction of the drain current. HCI degradation, which can significantly limit the performance of a device, particularly when operating the device with a high drain bias voltage, is generally strongly related to a magnitude of this lateral drift region field. Basically, the RESURF effect distributes electric field potential lines in the device at least in part by introducing a vertical field component into the drift region which helps to balance the drift region charge so as to reduce a curvature of the potential in the drift region field. This results in a more uniform distribution of the electric field at breakdown, compared to a device which does not utilize RESURF, thereby increasing a breakdown voltage of the device.

While it is known to optimize a device for breakdown voltage, an undesirable amount of HCI degradation in the device often results. Likewise, conventional methodologies for reducing HCI degradation in the device often undesirably decrease the breakdown voltage of the device. HCI degradation can significantly limit the performance and/or reliability of the device, particularly when operating the device at high drain bias voltages. As is well known, the HCI phenomenon generally results from heating and subsequent injection of charge carriers into a gate oxide and/or an oxide layer above a drift region of an LDMOS device. This injection of charge carriers often results in a localized and nonuniform buildup of interface states and oxide charges near and underneath a gate and/or in the drift region of the device. It has been shown that, over time, several electrical characteristics of the LDMOS device degrade as a direct result of HCI (see, e.g., S. Manzini et al., "Hot-Electron-Induced Degradation in High-Voltage Submicron DMOS Transistors," *Proc. IEEE ISPSD*, pp. 65-68, 1996, which is incorporated by reference herein). For example, HCI can produce variations in certain characteristics of the LDMOS device, including saturation current, threshold voltage, transconductance, on-resistance, etc., thus undesirably affecting the performance and/or reliability of the device.

There exists a need, therefore, for a metal-oxide semiconductor (MOS) device having improved power density, particularly when biased at a high drain voltage, that does not suffer from one or more of the problems exhibited by conventional MOS devices. Moreover, it would be desirable if the improved MOS device was compatible with existing integrated circuit (IC) fabrication process technologies.

SUMMARY OF THE INVENTION

The present invention meets the above-noted need by providing techniques for beneficially increasing power density in an MOS device, without increasing on-resistance or decreasing breakdown voltage in the device. For example, in accordance with an illustrative embodiment of the present invention, an LDMOS is formed having a buried layer which is arranged so as to minimize HCI while controlling at least an on-resistance, maximum drain current, and/or breakdown voltage in the device so as to achieve a desired electrical performance in the device. Moreover, the techniques of the present invention can be used to fabricate an integrated circuit including, for example, one or more LDMOS devices, using conventional MOS compatible process technology. Consequently, the cost of manufacturing the integrated circuit is not significantly increased.

In accordance with one aspect of the invention, an MOS device is formed including a semiconductor layer of a first conductivity type, and source and drain regions of a second conductivity type formed in the semiconductor layer proximate an upper surface of the semiconductor layer. The source and drain regions are spaced apart relative to one another. A drift region of the second conductivity type is formed in the semiconductor layer proximate the upper surface of the semiconductor layer and at least partially between the source and drain regions, the drift region having an impurity doping concentration, which may be referred to herein as a doping dose, greater than about 2.0e12 atoms per square centimeter (atoms/cm$^2$). An insulating layer is formed on at least a portion of the upper surface of the semiconductor layer. The device further includes a gate formed on the insulating layer at least partially between the source and drain regions, and a buried layer of the first conductivity type formed in the semiconductor layer in close relative proximity to and beneath at least a portion of the drift region. A substantially vertical distance between the buried layer and the drift region, and/or one or more physical dimensions of the buried layer are configured so as to minimize HCI while optimizing a power density of the device relative to at least one of an on-resistance and a maximum drain current of the device.

The distance between the buried layer and the drift region may be selected such that a channel region, which is formed in the semiconductor layer proximate the upper surface of the semiconductor layer and at least partially between the first source/drain region and the drift region, is substantially pinched-off under on-state operation of the device before the drift region is depleted when an increasing voltage is applied between the second and first source/drain regions.

In accordance with another aspect of the invention, an MOS device comprises a semiconductor layer of a first conductivity type, and source and drain regions of a second conductivity type formed in the semiconductor layer proximate an upper surface of the semiconductor layer, the source and drain regions being spaced apart relative to one another. A drift region of the second conductivity type is formed in the semiconductor layer proximate the upper surface of the semiconductor layer and at least partially between the source and drain regions, the drift region having an impurity doping concentration greater than about 2.0e12 atoms/cm$^2$. An insulating layer is formed on at least a portion of the upper surface of the semiconductor layer, and a gate is formed on the insulating layer at least partially between the source and drain regions. A channel region of the first conductivity type is formed in the semiconductor layer proximate the upper surface of the semiconductor layer and at least partially between the source region and the drift region. The device further includes a buried layer of the first conductivity type formed in the semiconductor layer in close relative proximity to and beneath at least a portion of the drift region. The buried layer is configured such that the drift region is not fully depleted before the channel region is pinched-off, whereby a transconductance of the device for an applied drain-to-source voltage greater than a knee voltage associated with the device is within about 20 percent of a peak channel transconductance of the device.

In accordance with yet another aspect of the invention, an MOS device includes source and drain regions of a first conductivity type formed in a semiconductor layer of a second conductivity type; an insulating layer formed on at least a portion of an upper surface of the semiconductor layer; a gate formed on the insulating layer at least partially between the source and drain regions; a drift region formed in the semiconductor layer proximate the upper surface of the semiconductor layer and between the source and drain regions; and a buried layer of the second conductivity type formed in the semiconductor layer under at least a portion of the drift region. The device is configured so as to provide a maximum drain current measurement of greater than about 190 milliamperes per millimeter and an on-resistance of less than about 15 ohms-millimeter, while maintaining a breakdown voltage of about 80 volts in the device, the maximum drain current measurement being defined as a drain current at which a transconductance of the device reduces to about ten percent of a peak transconductance value as a function of a gate voltage applied to the gate for a desired voltage applied between the drain and source regions.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative complementary MOS (CMOS) IC fabrication technology suitable for forming discrete LDMOS transistors, as well as circuits and/or other devices. It should be appreciated, however, that the present invention is not limited to the fabrication of this or any particular circuit or other device. Rather, the invention is more generally applicable to an improved MOS device which is advantageously configured to optimize a power density in the device, without significantly impacting breakdown voltage and/or HCI degradation. Moreover, the improved device is fully compatible with an MOS process technology.

Although implementations of the present invention are described herein with specific reference to an LDMOS device, it is to be appreciated that the techniques of the present invention are similarly applicable to other devices, as will be understood by those skilled in the art. Furthermore, although the invention will be described herein in the context of an N-channel MOS device, it is to be understood by those skilled in the art that a P-channel MOS device could be similarly formed by substituting opposite polarities to those given for the N-channel embodiment, in at least the active regions of the device, and that the techniques and advantages of the present invention will also apply to the alternative embodiment.

It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual IC device.

As previously stated, the present invention provides techniques for forming an MOS device having increased power density. The maximum usable power density of an MOS device is generally measured under radio frequency (RF) conditions and is typically defined as the output power of the device per unit gate width at which the device ceases to operate linearly. A useful metric for measuring the linearity of the output power is the one decibel (dB) compression point. Output power is a linear function of input power for relatively low input power levels. As the input power level increases, the output power becomes a sub-linear function of the input power. The 1 dB compression point is typically defined as the output power per unit gate width above which the gain is compressed 1 dB from linearity.

Figure 1:
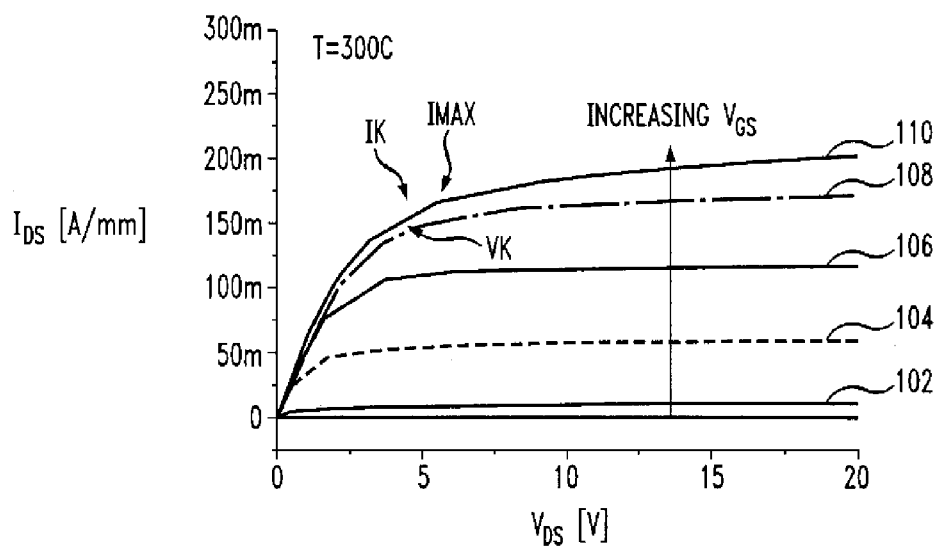
FIG. 1 is a graphical representation depicting exemplary drain current versus drain voltage curves corresponding to increasing levels of gate-to-source voltage ($V_{GS}$) for an illustrative MOS device.

Although maximum usable power density is generally measured under RF excitation, it is also possible to correlate power density to certain direct current (DC) characteristics of the device (e.g., current-voltage (I-V) behavior). There are many metrics which can be used to predict power density from the DC I-V characteristics of the device. One method is to identify knee voltage (VK) and knee current (IK) points of the drain-to-source current ($I_{DS}$) versus drain-to-source voltage ($V_{DS}$) curve fir the device. FIG. 1 is a graphical representation depicting exemplary drain current versus drain voltage curves 102, 104, 106, 108 and 110 corresponding to increasing levels of gate-to-source voltage ($V_{GS}$) for an illustrative MOS device. A high power density is obtained when VK is low, IK is high and the breakdown voltage (VBD) is high. Notwithstanding power density considerations, it is important that the knee voltage be as small as possible in the MOS device. Low knee voltage typically results in a more efficient power amplifier since it allows the largest possible drain voltage swing for a given DC drain bias (see, e.g., S. C. Cripps, "RF Power Amplifiers for Wireless Communications," pp. 60-63, ISBN 0-89006-989-1, Artech House, Inc. (1999), the disclosure of which is incorporated by reference herein). Consequently, a good metric for predicting power density will preferably examine the drain current $I_{DS}$ of the device at low $V_{DS}$.

Figure 2:
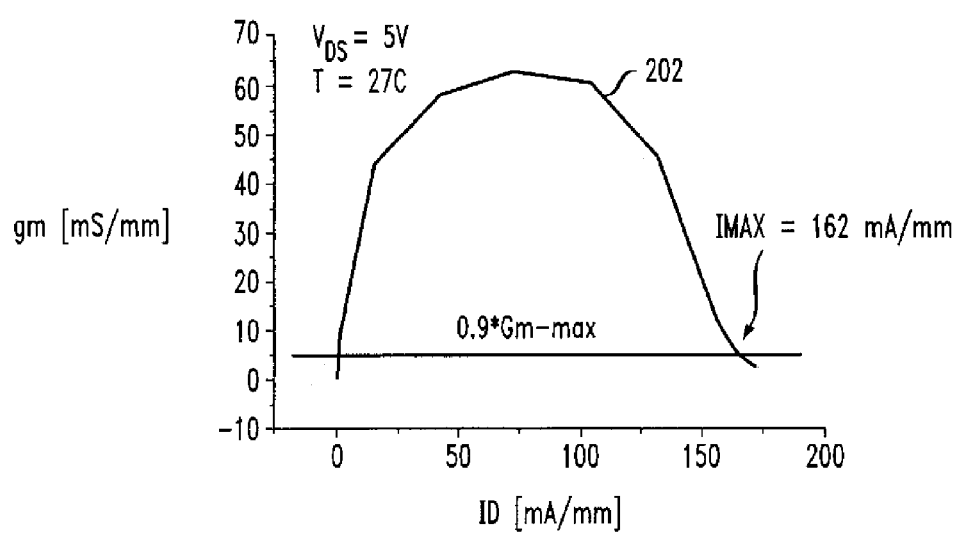
FIG. 2 is a graphical representation depicting one method for determining a maximum drain current measurement from an exemplary transconductance versus drain current curve for the illustrative device corresponding to FIG. 1.

A maximum current measurement, IMAX, is defined herein for assessing power density. The maximum current measurement preferably examines the drain current of the MOS device at low $V_{DS}$. A value of five volts may be chosen as an appropriately low $V_{DS}$ in order to evaluate how much power can be extracted from the device, although the invention is not limited to operation of the device at this or any particular drain-to-source voltage. Here, IMAX is defined as the drain current ID at which a transconductance (gm) of the device, which is substantially equal to a rate of change of the drain current with respect to a change in gate-to-source voltage ($\partial ID/\partial V_{GS}$) to at least a first order, reduces to about ten percent of its peak value as a function of $V_{GS}$. FIG. 2 shows a graphical representation depicting one way in which IMAX may be determined from an exemplary transconductance versus drain current curve 202, for the illustrative device corresponding to FIG. 1. As shown in FIG. 2, IMAX is determined to be about 162 milliamperes (mA) per millimeter (mm) unit gate width, which roughly corresponds to the maximum drain current achievable at $V_{DS}$ equal to 5 volts for the exemplary MOS device.

The value of IMAX shown in the exemplary curve 202 depicted in FIG. 2 corresponds to a device temperature of about 27 degrees Celsius (C.). For large power MOS devices, a pulsed I-V measurement, in which device biases are applied fast enough to ensure that thermal self-heating does not occur, may be required so that the device measurements used to obtain IMAX are obtained when the device is at a temperature of about 27 degrees C. When IMAX is increased in a device, power density is improved accordingly. Furthermore, a device having a high IMAX will also advantageously exhibit a low on-resistance. On-resistance may be defined as the maximum change in drain current per change in drain-to-source voltage, or $\partial ID/\partial V_{DS}$, obtained when the device is biased at $V_{DS}$=0V and $V_{GS}$ is varied.

Figure 3:
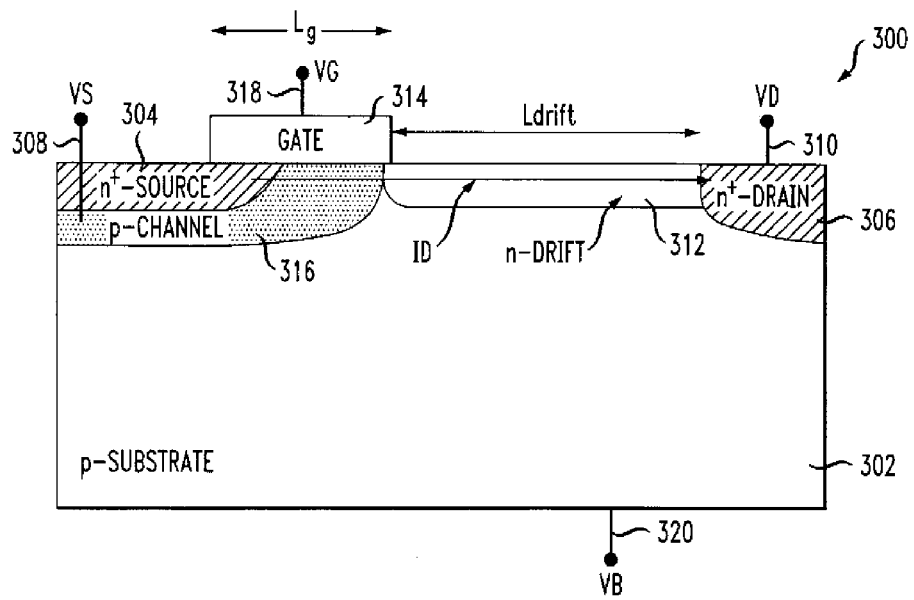
FIG. 3 is a cross-sectional view depicting at least a portion of a semiconductor wafer including a standard LDMOS device.

FIG. 3 illustrates a cross-sectional view of at least a portion of a semiconductor wafer comprising a standard LDMOS device 300. The LDMOS device 300 includes a semiconductor substrate 302. The substrate 302 is commonly formed of single-crystal silicon (e.g., having a <100> or <111> crystal orientation) which has been modified by adding an impurity or dopant to change the conductivity of the material (e.g., n-type or p-type). Here, the substrate 302 is of p-type conductivity and may thus be referred to as a p-substrate.

The exemplary LDMOS device 300 further includes a source region 304 and a drain region 306 formed in the substrate 302, proximate an upper surface of the substrate, such as by a conventional implant and diffusion process. The source and drain regions are preferably doped, such as by a conventional implant step, with an impurity of a known concentration level to selectively change the conductivity of the material as desired. In the LDMOS device 300, the source and drain regions 304, 306 are formed of n-type conductivity. A source contact 308, and a drain contact 310 are included in the LDMOS device 300 for providing electrical connection to the source region 304 and drain region 306, respectively. A channel region 316 and a drift region 312 are formed in the LDMOS device 300. The channel region 316 is typically formed proximate the upper surface of the substrate 302 and adjacent to the source region 304. A portion of the channel region 316 may be formed under the source region 304, as shown. The drift region 312 is also formed proximate the upper surface of the substrate 302 and extends substantially horizontally, defined as being in a plane substantially parallel to the substrate, between the channel region 316 and the drain region 306. A drift region length may be defined as Ldrift. The channel region 316 may be formed of a material having the same conductivity type as the substrate, in this case p-type. The drift region 312 may be formed of a material having the same conductivity type as the source and drain regions, in this case n-type.

The LDMOS device 300 further includes a gate 314 formed above at least a portion of the channel region 316 and proximate the upper surface of the substrate 302. The gate 314 is commonly formed of polysilicon material. The gate 314 is electrically isolated from the channel region 316 by an insulating layer (not shown), generally referred to as gate oxide, formed under the gate. A gate length of the LDMOS device 300 may be defined as Lg. A gate contact 318 provides electrical connection to the gate 314. Due at least in part to the relatively high electric field concentration near the edges of the gate 314 and the close relative proximity of the gate to an interface between the upper surface of the silicon substrate 302 and the oxide layer, HCI often occurs at the silicon/oxide interface near the drift region 312 immediately proximate an edge of the gate.

In the LDMOS device 300, a gate voltage VG applied to the gate contact 318 modulates the current flowing from the source region 304 to the drain region 306. In an LDMOS device, the drain current ID flows essentially along the Si surface. The path through which the drain current flows generally comprises the n-type source region 304, the p-type channel region 316, and the n-type drain region 306. It is important that the drift region be relatively lightly doped in order to support high drain biases (e.g., greater than about 70 volts) without the device experiencing voltage breakdown. In the following it is understood that the drain region 306 is biased to drain voltage VD and the source region 304 and channel region 316 are both connected by the source contact 308 to source bias voltage VS, which is typically at zero or ground potential (VS=0). A bulk contact 320 may be included for biasing the substrate 302 to a bulk voltage VB. Herein, it may assumed that all biases are referenced to VS, so that $V_{DS}$=VD–VS, $V_{BS}$=VB–VS, and $V_{GS}$=VG–VS.

As will be known by those skilled in the art, the LDMOS device 300 will be in an "on-state" when $V_{GS}$>VT, where VT is a threshold voltage of the device, and it is in an "off-state" when $V_{GS}$<VT. In the off-state, very little current flows through the channel region 316 from source region 304 to the drain region 306. In the on-state, the gate bias VG induces a conducting channel of electrons beneath the gate 314 from the source region 304 to the drain region 306, thereby providing electrical contact between the two regions. A breakdown voltage VBD can be measured in the off-state when a conducting channel exists in the device and may be defined as the drain-to-source voltage $V_{DS}$ above which the drain current ID increases rapidly from its initial off-state level. At $V_{DS} \geq$ VBD, high electric fields in the drift region 312 will generally produce undesirable impact ionization of the small density of electrons in this region leading to exponential current multiplication.

As $V_{GS}$ is raised above VT in the on-state, the carrier density induced in the channel region 316 of the LDMOS device 300 is increased and the channel region is able to conduct greater current. However, because power devices typically require a relatively low impurity doping concentration in the drift region 312 in order to support high voltage operation, the conductivity of the drift region is typically relatively low. As a result, above a certain $V_{GS}$ level, the channel region 316 is able to support more current than the drift region 312, and this will set the limit on the amount of current that can flow in the device. Therefore, the conductivity of the drift region 312 predominantly sets IMAX. Moreover, because the drift region conductivity is low, on-resistance, which is essentially a sum of a resistance of the channel region 316 and a resistance of the drift region 312, is relatively high (e.g., about several tens of ohms-mm).

An LDMOS device can be roughly modeled as a conventional field effect transistor (FET) with a voltage dependent resistor RD connected to its drain. At low drain voltage, RD is substantially constant (RD0) and is determined by the impurity doping concentration in the drift region. The on-resistance is the sum of the channel resistance and RD0. The higher the doping concentration in the drift region, the lower RD0 and RON will be. As drain voltage is increased, RD ceases to be constant and begins to increase to the point at which IMAX is limited. In principle, IMAX is limited primarily by two effects. First, as the voltage potential in the drift region increases, mobile carriers in the drift region are depleted by electric fields from the substrate, thereby limiting the current carrying capability of the drift region. This, depletion is required in order to achieve a high breakdown voltage (e.g., greater than about 70 volts) in the device. Second, as the electric field in the drift region increases, electron velocity in the drift region becomes saturated and can no longer sustain an increase in current. The first limitation, set by depletion from the substrate, usually dominates and the velocity saturation limit is generally not obtained in practice.

The higher the drift region doping, the higher IMAX will be, which is desirable in a power LDMOS device. Consequently, increased IMAX and reduced on-resistance (and therefore increased power density) require increased drift region doping. It is also clear that increased depletion from the substrate will reduce IMAX. Depletion from the substrate may have less of an effect upon on-resistance since on-resistance is typically measured at a drain voltage near zero volts, where the depletion of the drift region charge is at a minimum.

Figure 4:
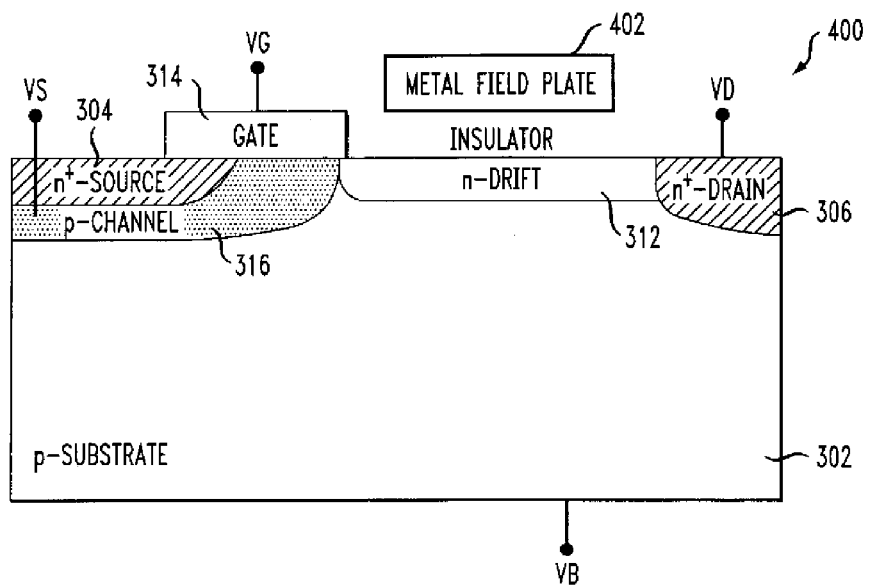
FIG. 4 is a cross-sectional view depicting at least a portion of a semiconductor wafer including a standard LDMOS device having a field plate for reducing HCI degradation in the device.

FIG. 4 illustrates a cross-sectional view of at least a portion of a semiconductor wafer comprising a standard LDMOS device 400 employing a field plate structure 402 for reducing HCI degradation in the device. Except for the addition of the field plate 402, LDMOS device 400 may be formed in a manner similar to the LDMOS device 300 depicted in FIG. 3. Specifically, LDMOS device 400 includes n-type source and drain regions 304 and 306, respectively, formed in a p-type substrate 302, proximate an upper surface of the substrate. The LDMOS device 400 also includes a p-channel region 316 and a drift region 312. The channel region 316 is typically formed proximate the upper surface of the substrate 302 and adjacent to the source region 304. A portion of the channel region 316 may be formed under the source region 304, as shown. The drift region 312 is also formed proximate the upper surface of the substrate 302 and extends substantially horizontally between the channel region 316 and the drain region 306.

The LDMOS device 400 further includes a gate 314 formed above at least a portion of the channel region 316 and proximate the upper surface of the substrate 302. Due at least in part to the relatively high electric field concentration near the edges of the gate 314 and the close relative proximity of the gate to an interface between the upper surface of the substrate 302 and an oxide layer (not shown) formed over the upper surface of the substrate, HCI often occurs at the silicon/oxide interface in the drift region 312 immediately proximate an edge of the gate. In order to reduce HCI degradation in the LDMOS device 400, field plate 402 may be formed between the gate 314 and the drain region 306. The field plate 402 is formed in close relative proximity to the upper surface of the substrate 302, above at least a portion of the drift region 312 of the LDMOS device 400. The field plate 402, which typically comprises metal, is electrically isolated from the gate 314 by the oxide layer formed on the upper surface of the device 400.

A field plate can be used to achieve an effect similar to the RESURF effect previously described. In a surface device, like LDMOS device 400, the field plate 402 is typically held at a constant potential, usually grounded to the source region 304, such that as the drain-to-source voltage $V_{DS}$ is increased, a vertical electric field that is orthogonal to a length Ldrift (see FIG. 3) of the drift region 312 is formed between the field plate 402 and the drift region. When the field plate 402 is properly designed, the charge in the drift region 312 is substantially depleted and the drift region field is reduced. A careful balance between the vertical and surface fields must be maintained in order to reduce peak surface fields in the device 400. Improper design may lead to even worse surface fields, as discussed in the paper by H. Brech, entitled "Voltage Optimization for State of the Art RF-LDMOS for 2.1 GHz W-CDMA Cellular Infrastructure Applications," *Proceedings of IEEE MTT-S*, pp. 209-212, 2003, the disclosure of which is incorporated by reference herein.

The Brech paper describes an LDMOS device employing a field plate and having a doping concentration (dose) in the drift region of less than about 2.0e12 atoms/cm$^2$, to yield an on-resistance of 16 ohms-mm, a breakdown voltage of 72 volts and a drift region length Ldrift of 2.5 micrometers (μm). Brech describes another device having an on-resistance of 22 ohms-mm, a breakdown voltage of 90 volts, and a drift region length of 4 μm, which corresponds to a similar doping concentration of the drift region. A comparable result is disclosed in a paper by M. Shindo et al., entitled "High Power LDMOS For Cellular Base Station Applications," *Proceedings of IEEE ISPSD* 2001, pp. 107-110, which is incorporated by reference herein. Shindo describes a field plate LDMOS device having a doping concentration of 2.0e12 atoms/cm$^2$ or less to achieve an on-resistance of about 15 ohms-mm and a breakdown voltage of 69 volts.

Figure 5:
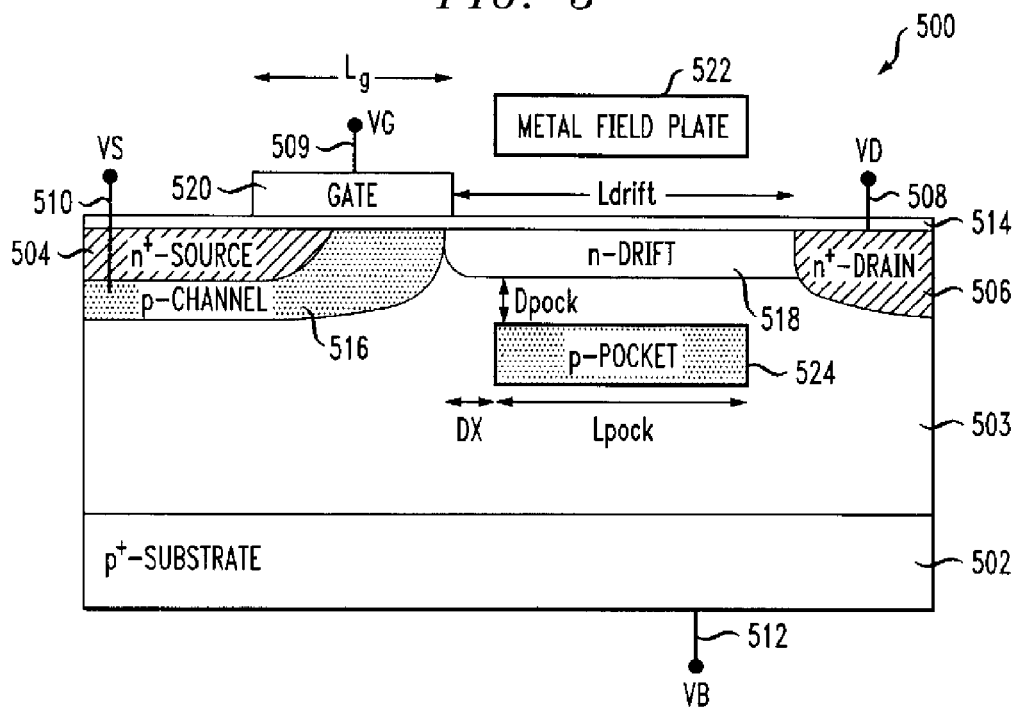
FIG. 5 is a cross-sectional view depicting at least a portion of a semiconductor wafer including an exemplary LDMOS device in which the techniques of the present invention are implemented.

FIG. 5 illustrates a cross-sectional view of at least a portion of a semiconductor wafer comprising an exemplary LDMOS device 500, formed in accordance with one embodiment of the present invention. The LDMOS device 500 includes a semiconductor substrate 502. The substrate 502 is commonly formed of single-crystal silicon (e.g., having a <100> or <111> crystal orientation), although suitable alternative materials may also be used, such as, but not limited to, germanium, gallium arsenide, gallium nitride etc. Additionally, the substrate is preferably modified by adding an impurity or dopant (e.g., boron, phosphorous, arsenic, etc.) to change the conductivity of the material (e.g., n-type or p-type). In a preferred embodiment of the invention, the substrate 102 is of p-type conductivity and may thus be referred to as a p+ substrate. A p+ substrate may be formed by adding a p-type impurity or dopant (e.g., boron) of a known concentration level (e.g., about 5e18 to about 5e19 atoms per cubic centimeter) to the substrate material, such as by a diffusion or implant step, to change the conductivity of the material as desired.

An epitaxial layer 503 may be formed on at least a portion of the substrate 502, such as by a standard epitaxy process. By introducing selected types of impurities (e.g., boron, phosphorous, arsenic, etc.) into the epitaxial layer 503, a resistivity of the epitaxial layer can be modified as desired. The thickness of the epitaxial layer 503 is typically less than about 10 μm, although the present invention is not limited to any particular thickness of the epitaxial layer. In a preferred embodiment of the invention, the epitaxial layer 503 is doped with a p-type impurity (e.g., boron). The doping concentration of the epitaxial layer 503 is preferably lower (e.g., about $10^{15}$ to about $10^{16}$ atoms per cubic centimeter) in comparison to the doping concentration of the substrate 502, and may therefore be referred to as a p− epitaxial layer.

The term "semiconductor layer" as may be used herein refers to any semiconductor material upon which and/or in which other materials may be formed. The semiconductor layer may comprise a single layer, such as, for example, substrate 502, or it may comprise multiple layers, such as, for example, the substrate and epitaxial layer 503. The semiconductor wafer comprises the substrate 502, with or without the epitaxial layer 503, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which and/or in which a semiconductor structure may be formed.

The exemplary LDMOS device 500 further includes a source region 504 and a drain region 506 formed in the epitaxial layer 503, proximate an upper surface of the epitaxial layer, such as by a conventional implant and diffusion process. The source and drain regions are preferably doped, such as by a conventional implant step, with an impurity of a known concentration level to selectively change the conductivity of the material as desired. Preferably, the source and drain regions 504, 506 have a conductivity type associated therewith which is opposite a conductivity type of the substrate 502, so that active regions can be formed in the device. In a preferred embodiment of the invention, the source and drain regions 504, 506 are of n-type conductivity.

The LDMOS device 500 preferably includes a drain contact 508, electrically connected to the drain region 506, and a source contact 510, electrically connected to the source region 504. Electrical connection to the source region 504 may alternatively be made by way of a substrate contact 512. In this instance, electrical connection between the source region 504 and the substrate 502 may be provided by forming one or more trench sinkers (not shown) through the epitaxial layer 503 to the substrate. The trench sinkers may be formed in a conventional manner, such as, for example, by opening windows in the epitaxial layer 503 to expose the substrate 502 (e.g., by photolithographic patterning and etching), and filling the trenches with a conductive material, as will be understood by those skilled in the art. An oxide layer 514 (e.g., silicon dioxide), or alternative insulating layer, is generally formed on at least a portion of the upper surface of the epitaxial layer 503 to electrically isolate the source and drain contacts of the device as well as to protect the device.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

A channel region 516 and a drift region 518 are formed in the LDMOS device 100. Although shown as comprising a single lightly doped drain (LDD) region, it is to be appreciated that the drift region 518 may similarly comprise two or more LDD regions. Moreover, assuming more than one LDD region is employed, the respective doping concentrations of each of the LDD regions need not be the same relative to one another, but instead may be individually adjusted to control one or more characteristics of the drift region (e.g., electric field distribution) as desired. The channel region 516 is formed proximate the upper surface of the epitaxial layer 503 and adjacent to the source region 504. At least a portion of the channel region 516 may be formed under the source region 504, as shown. The drift region 518 is formed proximate the upper surface of the epitaxial layer 503 and extends substantially horizontally, defined as being in a plane substantially parallel to the substrate 502, between the channel region 516 and the drain region 506. At least a portion of the drift region 518 may be formed under the drain region 506. The channel region 516 may be formed of a material having the same conductivity type as the substrate, preferably p-type. The drift region 518 may be formed of a material having the same conductivity type as the source and drain regions, preferably n-type, although the relative doping concentration of the drift region compared to the source and drain regions is typically lower.

The exemplary LDMOS device 500 further includes a gate 520 formed above at least a portion of the channel region 516 and proximate the upper surface of the epitaxial layer 503. The gate may be formed of, for example, polysilicon material, although alternative suitable materials (e.g., metal) may be similarly employed. The gate 520 is electrically isolated from the channel region 516 by at least a portion of the oxide layer 514 formed under the gate. The portion of the oxide layer 514 under the gate 520 is often referred to as gate oxide. While the thickness of the gate oxide is preferably about 200 nanometers (nm), the present invention is not limited to a particular gate oxide thickness. A gate contact 509 is preferably included in the LDMOS device 500 for providing electrical connection to the gate 520. Due at least in part to the relatively high electric field concentration near the edges of the gate 520 and the close relative proximity of the gate to an interface between the upper surface of the silicon epitaxial layer 503 and the oxide layer 514, HCI often occurs at the silicon/oxide interface in the drift region 518, immediately proximate an edge of the gate 520.

In order to reduce HCI degradation in the LDMOS device 500, a field plate 522, or alternative shielding structure, may be formed on oxide layer 514, between the gate 520 and the drain region 506. The field plate 522 is preferably formed in close relative proximity to the upper surface of the epitaxial layer 503, above at least a portion of the drift region 518 of the LDMOS device 500. The field plate 522 is electrically isolated from the gate 520 by the oxide layer 514 formed on the upper surface of the device 500. Moreover, the thickness of the portion of the oxide layer 514 under the field plate 522 may be substantially larger than the gate oxide thickness (e.g., about 30 nm to about 300 nm), although essentially any oxide thickness may be employed. The reduction in HCI degradation in the LDMOS device 500 may be affected to some extent by the thickness of the oxide layer 514 under the field plate 522. It is to be understood that the field plate 522 is different from a source-extended field plate, often referred to as a Faraday shield. For example, the oxide thickness under the field plate 522 (e.g., about 2000 Angstroms) is preferably closer to the gate oxide thickness than it is to a field oxide thickness (FOX), as in the case of the Faraday shield.

The field plate 522 may overlap at least an edge of the gate 520 at a first end, although the field plate may alternatively be configured in a substantially non-overlapping arrangement relative to the gate, as shown. The amount of overlap of the field plate 522 above the gate 520 is preferably minimized in order to reduce a gate-to-source capacitance (Cgs) associated with the LDMOS device 500. A second end of the field plate 522 is preferably formed above at least a portion of the drift region 518 as the field plate extends substantially horizontally from the edge of the gate 520 towards the drain region 506. The field plate 522, like the gate 520, preferably comprises polysilicon, although suitable alternative materials (e.g., metal) may also be utilized.

The field plate 522 in the exemplary LDMOS device 500 is preferably electrically connected (e.g., strapped) to the source region 504 using, for example, one or more conductive traces, contact vias and/or conductive plugs (not shown). The conductive trace(s) and contact vias may be formed using a high level metalization process (e.g., second or higher level metal), while the conductive plug, which provides an electrical connection between the source region 504 and one of the contact vias, may be formed during the same process step used to form the field plate 522. The electrical connection between the field plate 522 and the source region 504 is preferably spaced far enough from the gate 520 so that the gate-to-source capacitance is not significantly increased. In a preferred embodiment of the invention, the electrical connection bridging the field plate 522 to the source region 504 is spaced about one micron from the gate 520. Alternative methods for forming the electrical connection between the field plate 522 and the source region 504 are similarly contemplated by the present invention.

In order to further control a distribution of the electric field in the drift region 518 of the LDMOS device 500, a buried layer 524 is formed in the epitaxial layer 503 having a conductivity type that is opposite the conductivity type of the drift region. In a preferred embodiment of the invention, the buried layer 524 is of p-type conductivity, and may therefore be referred to as a p-pocket. A p-type buried layer 524 may be formed by adding a p-type impurity or dopant (e.g., boron) of a known concentration level to the substrate material, such as by an implant step, to change the conductivity of the material as desired. The buried layer 524 is preferably formed proximate to and beneath at least a portion of the drift region 518. A substantially vertical spacing, as defined in a direction substantially orthogonal to a plane of the substrate 502, between the buried layer 524 and the drift region 518 may be represented by the dimension Dpock. In a preferred embodiment of the invention, Dpock is defined as the minimum vertical distance between a peak of the drift region doping and a point in the buried layer 524 where the doping concentration exceeds about 5e16 atoms per cubic centimeter ($cm^3$). A length of the buried layer 524, as defined in a direction substantially parallel to the substrate 502, may be represented by the dimension Lpock. A distance between an edge of the buried layer 524 closest to the source region 504 and an edge of the drift region 518 closest to the gate 520 may be defined by the dimension DX. These three dimensions, namely, Dpock, Lpock and DX, preferably establish a location of the buried layer 524 relative to at least the drift region 518 in the LDMOS device 500.

It is to be understood that the shape of the field plate 522, as well as the shape of the buried layer 524, can affect a distribution of equipotential lines, and thus an electric field distribution, in the LDMOS device 500. Thus, by controlling the shape of the field plate and/or buried layer 524, the electric field in at least the drift region 518 of the LDMOS device 500 can be more uniformly distributed so as to reduce HCI degradation.

By way of example only, and without loss of generality, in order to investigate the limitations imposed by device design on the characteristics Ron, IMAX, VBD and HCI, detailed process and device simulations of a typical baseline silicon LDMOS power transistor were performed. Careful comparisons between simulation and actual device measurements were obtained in order to calibrate simulation models and hence increase confidence in the simulated predictions. An initial device structure for this verification was a typical optimized LDMOS power RF transistor with a gate length Lg equal to 0.5 μm and a drift region length Ldrift equal to 3.0 μm. A field plate structure was used to control the drift region fields. Substantial agreement was achieved for full DC I-V curves including breakdown voltage and for small signal capacitances. The quantities Ron and IMAX were determined as described herein above. The baseline LDMOS transistor exhibited a breakdown voltage equal to 74 volts, an Ron equal to 15 ohm-mm, and a maximum current IMAX equal to 140 mA per mm. This baseline LDMOS device is representative of state-of-the art performance. Note, that these quantities are quoted as on-resistance Ron per mm of gate width and IMAX per mm of gate width, where the gate width is a width of the gate of the LDMOS device in a direction substantially orthogonal to a gate length Lg. In a well-designed device, IMAX will be substantially proportional to gate width, and Ron will be inversely proportional to gate width.

Device reliability can be measured experimentally as a degradation of drain current ID and Ron due primarily to HCI. Degradation of ID and Ron in the baseline device was found to be substantially correlated to impact ionization induced carrier multiplication. Carrier multiplication may be defined as a ratio of hole current produced by impact ionization of channel electrons to electron current flowing through the channel region. Experimentally, carrier multiplication can be determined by measuring the ratio IB/IS, where IS is a magnitude of source current and IB is a magnitude of substrate (bulk) current in the device. This measurement is made on special devices configured such that the substrate and the source electrodes are not electrically connected together, as they are in typical lateral power MOS transistors in order to reduce certain parasitics at RF.

These degradation measurements were performed at low ID and with $V_{DS}$=VDC=30 volts. Device degradation was found to be relatively sensitive to IB/IS. A desired degree of HCI reliability was found when IB/IS was less than about 0.04. Devices with IB/IS of about 0.07 were acceptable in many applications. An IB/IS>0.1 was found to be well outside of acceptable HCI reliability standards. Device degradation generally occurs when high electric fields in the drift region near the gate heat electrons to energies where such electrons can damage an oxide layer above the drift region. As previously mentioned, this damage results in trapped charge which may affect drain resistance RD and hence degrades Ron and IMAX characteristics of the device.

Two simulation measurements were used in order to assess HCI reliability in the device. The first measurement was IB/IS at VDS=VDC=30 volts, which could be readily compared to measured results. Simulations of IB/IS under these conditions matched substantially well with actual measurement. The second measurement was peak lateral field, Fmax, at VDS=VDC=30 volts. IB/IS is correlated to Fmax, but Fmax is more directly related to carrier heating and therefore serves as a better reliability indicator. Fmax can be simulated but not directly measured.

Using this baseline device as a starting point, simulations were performed in order to optimize the device to increase IMAX and reduce Ron, while maintaining the same breakdown voltage and HCI degradation. A breakdown voltage of 70 volts was established as a lower limit for the LDMOS device. A minimum breakdown voltage of about 70 volts is typically required for a class AB amplifier operating at VDC equal to 28 volts. For HCI degradation, an upper target limit of IB/IS≦0.07 is preferably established while maintaining the peak lateral field Fmax at substantially the same level as in the initial baseline device which had demonstrated an acceptable reliability. The limit on Fmax was found to be about 220 kilovolts (kV) per cm at VD=VDC.

The baseline LDMOS device employed an impurity doping concentration in the drift region of 2.0e12 atoms/cm$^2$, which represents a maximum doping concentration of the drift region used in standard LDMOS devices. High drift region fields were controlled to some extent by a field plate. Table 1 below illustrates exemplary simulation results for the LDMOS device depicting an effect of increased impurity doping concentration of the drift region on certain device characteristics, including IMAX, Ron, IB/IS and Fmax. These exemplary simulation results assume a drain voltage VD=VDC=28 volts, a source voltage equal to zero, a gate channel length of 0.5 µm, and a drift region length of 3 µm. It is to be appreciated, however, that the present invention is not limited to a device having these specific characteristics.

TABLE 1

| Doping Concentration ($10^{12}$ atoms/cm$^2$) | IMAX (mA/mm) | Ron (ohms-mm) | IB/IS | Fmax (kV/cm) |
|---|---|---|---|---|
| 2.0 | 150 | 16 | 0.05 | 210 |
| 2.8 | 209 | 13.2 | 0.27 | 301 |
| 3.2 | 238 | 12.3 | 0.50 | 343 |
| 3.6 | 265 | 11.7 | 0.89 | 382 |

As apparent from Table 1 above, the initial IMAX of 150 mA/mm and Ron of 16 ohms-mm for a doping concentration of 2.0e12 atoms/cm$^2$ is typical of state-of-the-art values for similar devices having a breakdown voltage of about 70 volts. HCI reliability in this device, which was simulated to have an IB/IS ration of 0.05, was within the desired target value of 0.07 or less. However, the simulations show that IB/IS increases significantly for doping concentrations of about 2.8e12 atoms/cm$^2$ or higher, resulting in IB/IS exceeding the target of 0.07. The above simulations further show that the peak drift region field corresponding to a doping concentration of 2.0e12 atoms/cm$^2$ was 210 kV/cm, which is below a desired limit of 220 kV/cm.

In accordance with one aspect of the present invention, an IMAX of 190 mA/mm or less and an on-resistance of less than about 15 ohms-mm are preferably selected as appropriate targets for an LDMOS device exhibiting high power density for a breakdown voltage which is less than about 80 volts. This corresponds to an increase of about 27 percent in IMAX and a reduction of about 10 percent in Ron. These IMAX levels require a significant increase in the doping concentration of the drift region of the device compared to conventional devices. When designing a device for a breakdown voltage of greater than 80 volts, a longer drift region length Ldrift may be required. For a given Ldrift value, when Ldrift is increased, IMAX will decrease and Ron will increase accordingly. When the breakdown voltage is greater than about 80 volts and the doping concentration of the drift region is greater than 2.0e12 atoms/cm$^2$, an appropriate target for IMAX and Ron is preferably about 160 mA/mm and 19 ohms-mm, respectively. The use of an impurity doping concentration of greater than about 2.0e12 atoms/cm$^2$ may also help decrease a sensitivity of the drift region to trapped charge created by hot carriers. For example, simulations were performed which demonstrated that the effect of fixed charge on Ron and IMAX in an LDMOS device was roughly half as small when the doping concentration was about 3e12 atoms/cm$^2$ compared to when the doping concentration was about 2.0e12 atoms/cm$^2$. A device configured such that HCI is substantially the same (e.g., as represented by substantially the same IB/IS and Fmax characteristics) with a doping concentration of about 3e12 atoms/cm² exhibits an HCI degradation lifetime which is up to ten times longer, or likewise an HCI degradation that is only half as severe, as a device having a doping concentration of about 2.0e12 atoms/cm² or less.

In a preferred embodiment of the invention, an impurity doping concentration of about 3.6e12 atoms/cm² is employed in the drift region of the LDMOS device. At a doping concentration of about 3.6e12 atoms/cm², exemplary simulations show that IMAX increased to about 265 mA/mm and Ron reduced to about 11.7 ohms-mm, as illustrated in Table 1 above. In fact, a doping concentration in the drift region of about 2.8e12 atoms/cm² beneficially yields about a 40 percent increase in IMAX and about an 18 percent decrease in Ron compared to the baseline LDMOS device having a doping concentration in the drift region of 2.0e12 atoms/cm², thus predicting a dramatic improvement in the power density of the device. However, even with this moderate increase in the drift region doping concentration, FMAX increases by over 40 percent, which increases IB/IS to about 0.27, well beyond a practical level for HCI degradation. The breakdown voltage in the device is also reduced by as much as 15 volts. For this reason, conventional state-of-the-art LDMOS devices demonstrate a practical upper limit for the doping concentration in the drift region of less than or equal to about 2.0e12 atoms/cm², and a corresponding on-resistance limitation of about 15 ohms-mm.

While the addition of the field plate 522 in the LDMOS device 500 provides some reduction in IB/IS, it is generally not feasible to configure the device so as to yield acceptable HCI degradation results without also significantly impacting breakdown voltage, parasitic capacitance and/or IMAX in the device. Also, reducing the impurity doping concentration in the drift region of the device for any substantial length of the drift region, as proposed by H. Baliga in U.S. Patent Publication No. US 2002/0185679, published Dec. 12, 2002 (hereinafter "Baliga"), which is incorporated by reference herein, cannot solve the high electric field problem in the device without significantly degrading IMAX. Thus, in accordance with the techniques of the present invention, a minimum doping concentration in the drift region of greater than 2.0e12 atoms/cm² is preferably established in order to obtain a desired increase in IMAX. Clearly, a more efficient RESURF structure is required which can control HCI and breakdown voltage in the device when the doping concentration in the drift region is larger than 2.0e12 atoms/cm². Such a RESURF structure is preferably configured to have a minimal negative impact on IMAX and Ron.

As will be described in further detail below with reference to FIG. 5, the buried layer 524 in the exemplary LDMOS device 500 is advantageously configured so as to control the peak electric field generated near the edge of the gate 520 proximate the drift region 518, and thereby control HCI and breakdown voltage in the device. A doping level of the buried layer 524 should be high enough to form an approximate ground plane when $V_{DS}$ approaches VDC, so that a voltage potential in this region is approximately equal to that of the substrate. In order to accomplish this, a doping concentration of the buried layer 524 is preferably high enough such that the buried layer is not fully depleted for $V_{DS}$ substantially below VDC. In a preferred embodiment of the invention, the doping concentration of the buried layer 524 is in a range from about 5e16 to about 5e17 atoms/cm³. As the doping concentration in the drift region 518 is increased, a curvature of the potential in the drift region causes the electric field to increase as it approaches the gate edge. Consequently, the drain voltage will drop across a smaller section of the drift region near the gate generating high electric fields. Proper configuration of the buried layer 524 in the device is required in order to achieve the desired power density and HCI, and is unique with respect to buried RESURF structures taught by the prior art.

As previously explained, placement and configuration of the buried layer 524 in the LDMOS device 500 may be defined at least in terms of the dimensions Lpock, Dpock and/or DX. The dimensions Dpock and DX establish the location of the buried layer 524 relative to the drift region 518, while the dimension Lpock defines the length of the buried layer. In a preferred embodiment of the invention, DX is substantially equal to zero. As Dpock is reduced, a high vertical field is formed between the buried layer 524 and that part of the drift region 518 proximate the buried layer. This field acts, at least in part, to compensate the curvature of the potential in the drift region 518 near the gate 520 induced by the large doping concentration in the drift region. When Dpock is low enough (e.g., about 0.4 μm), the curvature of the potential in the drift region changes sign, pushing the high electric fields away from the gate 520. Although having a low Dpock reduces the peak field near the gate, further specification of the placement of the buried layer 524 is preferable in order to ensure a high breakdown voltage (e.g., greater than about 70 volts), and to satisfy desired IMAX and on-resistance requirements for the device without significantly increasing HCI.

Table 2 below illustrates exemplary simulation results for the LDMOS device depicting an effect of varying the spacing between the buried layer 524 and the drift region 518, as defined by the dimension Dpock, on certain device characteristics, including IMAX, Ron, IB/IS, Fmax and VBD. These exemplary simulation results assume a doping concentration in the drift region 518 of 3.2e12 atoms/cm², DX equal to zero and a buried layer length (Lpock) of 0.75 μm. It is to be appreciated, however, that the present invention is not limited to a device having these specific characteristics.

TABLE 2

| DX (μm) | Dpock (μm) | Lpock (μm) | IMAX (mA/mm) | Ron (ohms-mm) | IB/IS | FMAX (kV/cm) | VBD (volts) |
|---|---|---|---|---|---|---|---|
| 0.0 | 0.4 | 0.75 | 213 | 12.8 | 0.04 | 212 | 76 |
| 0.0 | 0.6 | 0.75 | 226 | 12.6 | 0.10 | 230 | 72 |
| 0.0 | 0.9 | 0.75 | 235 | 12.3 | 0.22 | 270 | 72 |
| 0.0 | 1.3 | 0.75 | 237 | 12.3 | 0.30 | 310 | 74 |

The dimensions for Dpock shown above in Table 2 are preferably chosen so as to establish an effective ground plane under the drift region 518 of the LDMOS device 500, as previously explained. As apparent from Table 2, when the buried layer 524 is closest to the drift region 518 (e.g., Dpock=0.4 μm), both VBD and IB/IS are well within the desired ranges, namely, VBD>70 volts and IB/IS<0.07. When Dpock is increased to 0.6 μm, IB/IS becomes too large (0.10) to maintain satisfactory HCI reliability in the device. Although the optimal value for the distance Dpock may change somewhat as a function of the doping concentration in the drift region, maintaining Dpock equal to or less than about 0.5 μm is preferred for essentially any doping concentration of the drift region greater than 2.0e12 atoms/cm². In a preferred embodiment of the invention, the minimum doping concentration in the drift region 518 used together with the buried layer 524 is greater than about 2.5e12 atoms/cm², and is preferably about 3.2e12 atoms/cm².

With all other variables being held substantially constant, the lateral placement of the buried layer 524 in the LDMOS device 500, at least in relation to the drift region 518, may also be used to control certain characteristics of the device, such as, for example, IMAX, IB/IS, FMAX and VBD. In the exemplary simulation results depicted in Table 2, a left edge of the buried layer 524 was substantially aligned to a drain side of the gate, so that DX was zero. Table 3 below illustrates exemplary simulation results for the LDMOS device 500 depicting an effect of varying the lateral distance of the buried layer 524 with respect to the drift region 518, as defined by the dimension DX, on certain device characteristics of the device, including IMAX, Ron, IB/IS, Fmax and VBD. These exemplary simulation results assume a doping concentration in the drift region 518 of 3.2e12 atoms/cm$^2$, Dpock equal to 0.4 µm, and Lpock equal to 0.75 µm. It is to be understood, however, that the present invention is not limited to a device having these specific characteristics.

TABLE 3

| DX (µm) | Dpock (µm) | Lpock (µm) | IMAX (mA/mm) | Ron (ohms-mm) | IB/IS | FMAX (kV/cm) | VBD (volts) |
|---|---|---|---|---|---|---|---|
| 0.0 | 0.4 | 0.75 | 213 | 12.8 | 0.04 | 212 | 76 |
| 0.2 | 0.4 | 0.75 | 208 | 13.1 | 0.04 | 214 | 74 |
| 0.4 | 0.4 | 0.75 | 201 | 13.2 | 0.14 | 246 | 71 |
| 1.0 | 0.4 | 0.75 | 190 | 13.3 | 0.21 | 281 | 62 |

The exemplary simulation results depicted in Table 3 above illustrate that when the doping concentration in the drift region is greater than 2.0e12 atoms/cm$^2$, an optimal location of the buried layer 524 occurs when the buried layer is substantially aligned (DX=0) with the edge of the drift region 518 proximate the gate 520. As apparent from Table 3, when lateral distance DX is increased beyond 0.4 µm, IB/IS increases dramatically beyond the desired HCI reliability limits. This is due, at least in part, to the fact that when the buried layer 524 is located away from the gate edge, it has less of an impact on the drift region potential curvature near the gate and is therefore less effective in suppressing electric field penetration in the drift region of the device. Furthermore, when DX increases, IMAX decreases accordingly, which is undesirable. Having the buried layer located substantially near the drift region (e.g., Dpock about zero) and spaced laterally away from the gate (e.g., DX>0.4 µm), where the potential difference between the drift region and the substrate is larger than it is when the buried layer is near the gate, causes a greater depletion of the drift region under on-state conditions. This results in a correspondingly larger reduction of IMAX. Thus, in accordance with a preferred embodiment of the invention, in order to maximize both HCI reliability and IMAX, the buried layer 524 is configured such that its lateral position (DX) relative to the drift region 518 and/or gate 520 is less than about 0.4 µm.

Another important characteristic which may affect certain electrical properties of the LDMOS device, including IMAX, on-resistance and breakdown voltage of the device, is the length Lpock of the buried layer 524, as measured in a direction substantially parallel to a plane of the substrate 502. Table 4 below depicts exemplary simulation results for the LDMOS device 500 illustrating an effect of varying the length Lpock of the buried layer 524 while keeping other variables associated with the device, such as, for example, DX, Dpock, etc., substantially constant. These exemplary simulation results assume a doping concentration in the drift region 518 of 3.2e12 atoms/cm$^2$, DX equal to zero, Dpock equal to 0.4 µm, and a length of the drift region Ldrift equal to 3 µm. It is to be understood, however, that the present invention is not limited to a device having these specific characteristics.

TABLE 4

| DX (µm) | Dpock (µm) | Lpock (µm) | IMAX (mA/mm) | Ron (ohms-mm) | IB/IS | FMAX (kV/cm) | VBD (volts) |
|---|---|---|---|---|---|---|---|
| 0.0 | 0.4 | 0.75 | 213 | 12.8 | 0.04 | 212 | 76 |
| 0.0 | 0.4 | 1.50 | 186 | 13.6 | 0.06 | 198 | 62 |

Table 4 shows exemplary simulated results when Lpock is increased from a value of 0.75 µm to 1.50 µm. With the buried layer 524 preferably substantially aligned to the edge of the gate 520 (DX=0) and spaced in close relative proximity to the drift region 518 (Dpock=0.4 µm) as previously advocated, it is still possible to control certain characteristics of the device, such as, for example, FMAX and IB/IS when $V_{DS}$=VDC. However, as the length of the buried layer is increased, since the buried layer will subtend an increasingly larger portion of the drift region length, drift region depletion in the on-state of the device is affected in the same way as when DX was increased (as shown in Table 3 above). Thus, IMAX is substantially reduced as the length of the buried layer is increased.

By increasing the length of the buried layer 524, the breakdown voltage VBD of the LDMOS device 500 is also undesirably reduced. As apparent from Table 4, VBD decreases from 76 volts to 62 volts as Lpock is increased from 0.75 µm to 1.50 µm. This is due, at least in part, to the fact that when Lpock is increased to 1.5 µm, which is half of the length of the drift region (Ldrift=3.0 µm), the electric field is excluded from up to one half of the drift region. Therefore, in the off-state, most of the drain field is pushed towards the drain side of the drift region, thereby generating a field spike which reduces the breakdown voltage in the device. When Lpock is less than about one half of Ldrift but larger than about 0.2 µm, the drift region field can be balanced in such a way that both HCI and VBD are controlled to a satisfactory degree. In a preferred embodiment of the invention, Lpock is equal to about 0.75 µm.

It is to be understood that, in accordance with the techniques of the present invention, a minimum value for the vertical distance, Dpock, between the buried layer 524 and the drift region 518 is preferably established. The value of Dpock is preferably chosen so as to ensure that, under on-state operation, the channel region 516 in the device is effectively pinched-off before the drift region 518 is depleted when the drain voltage $V_D$ is increased. This is contrary to the teaching of Baliga, which advocates that the drift region be depleted before the channel region is pinched-off.

For essentially all power RF MOS devices, there is a gate-to-source voltage $V_{GS}$ above which the drift region 518 will be depleted before the channel region 516 can attain pinch-off. This is because the channel region can generally always be made more conductive with higher $V_{GS}$, so that an effective resistance of the channel region is lower than a resistance of the drift region. In standard low-voltage MOS devices wherein the drain region extends directly to the channel region without an intervening drift region, the channel region can always be pinched-off. In such a device, the drain current ID will be larger than a comparable device having a drift region, and the maximum transconductance (gm) of the intrinsic channel region can be achieved. To obtain a desired IMAX, the exemplary LDMOS device preferably operates as closely to this optimum operating condition as possible.

Figure 6:
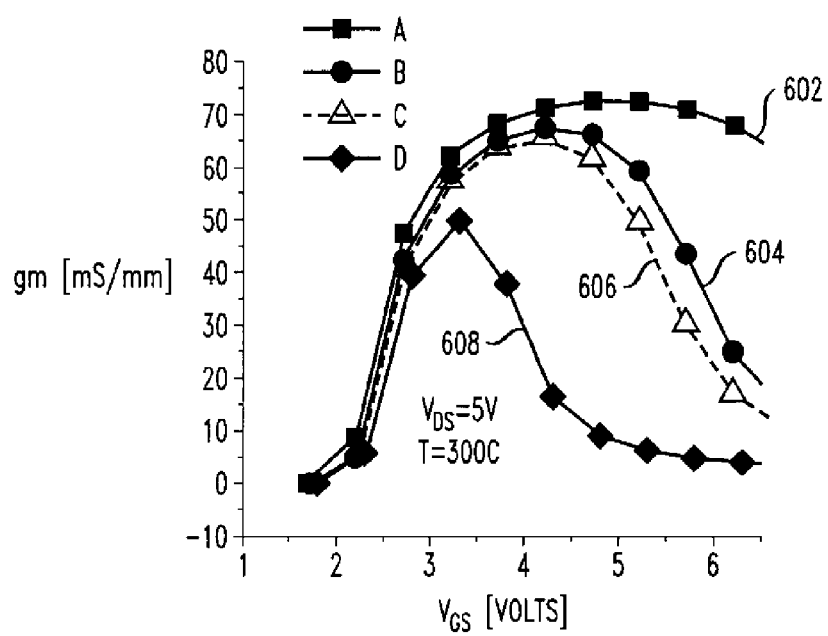
FIG. 6 is a graphical representation illustrating an effect of drift region depletion on transconductance before channel pinch-off is achieved, for exemplary LDMOS devices having different buried layer and/or drift region arrangements, in accordance with the present invention.

FIG. 6 is an exemplary graphical representation illustrating an effect of drift region depletion on transconductance before channel pinch-off is achieved. The graph includes several curves representing various device configurations at a drain-to-source voltage of 5 volts and a temperature of 27 degrees C. Specifically, curve 602 represents an ideal MOS device having no drift region at all. Curve 604 represents an LDMOS device having a drift region with a doping concentration of 3.2e12 atoms/cm$^2$, but with no buried layer. For a relatively large range of $V_{GS}$ (e.g., up to about 4 volts), the LDMOS device corresponding to curve 604 has nearly identical transconductance compare to the ideal device corresponding to curve 602, thus demonstrating that the channel region in the device corresponding to curve 604 achieves pinch-off before the drift region is depleted. The LDMOS device represented by curve 604 exhibits current limiting only after about 90 percent of its peak transconductance is obtained.

Curve 606 corresponds to an exemplary LDMOS device with a doping concentration of the drift region of 3.2e12 atoms/cm$^2$ and having a buried layer formed in a manner similar to the techniques of the present invention described herein. This device operates in a manner substantially similar to that of the devices represented by curves 602 and 604, at least for $V_{GS}$ up to about 4 volts, and thus clearly shows that up to $V_{GS}$ equal to about 4 volts, the channel region in the device is fully pinched-off. In the mode of operation specified herein, the reduction of IMAX due to the buried layer is substantially minimized.

As shown by curve 608, when Dpock is reduced such that a channel region in the LDMOS device is maintained substantially in a linear mode of operation, as per Baliga (e.g., Dpock<0.2 μm), transconductance in the device departs from the ideal device curve 602 for significantly lower $V_{GS}$ (e.g., about 2.5 volts), and the value of peak gm attainable in this device is more than about 40 percent lower compared to the exemplary LDMOS device formed in accordance with the methodologies of the present invention. The transconductance of the device corresponding to curve 606 will always be higher than the device corresponding to curve 608 and extends further in $V_{GS}$. Therefore, the IMAX will be much larger in a device employing the techniques of the present invention, compared to conventional devices, since IMAX is defined as the value of drain current below which transconductance reduces to one tenth of its peak value. In a preferred embodiment of the invention, the buried layer is configured such that the drift region is not depleted before the channel region is fully pinched-off, so that the transconductance for $V_{DS}$ above the knee voltage is within about 20 percent of a peak channel transconductance in the device.

Figure 7:
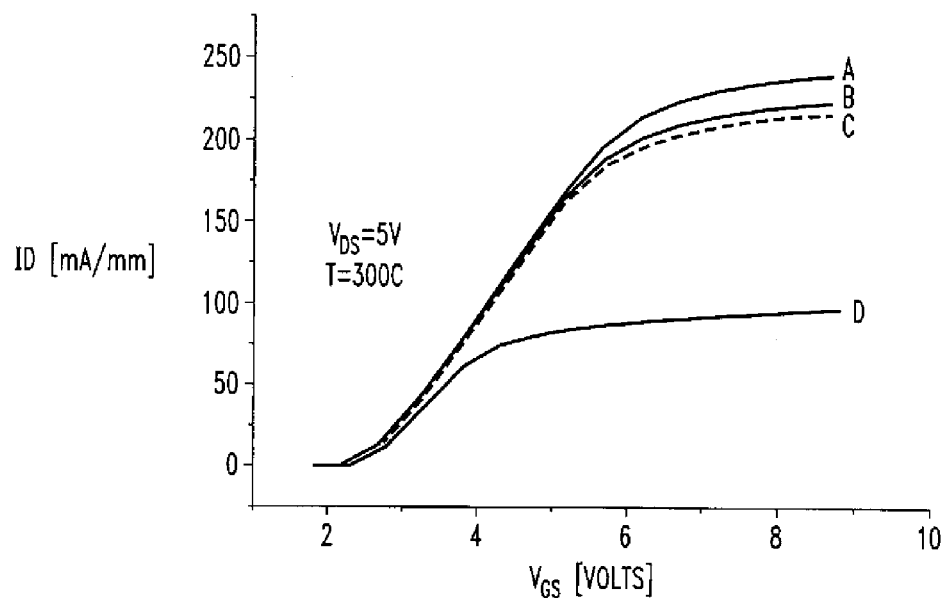
FIG. 7 is an graphical representation illustrating an effect of drift region depletion on drain current before channel pinch-off is achieved, for exemplary LDMOS devices having different buried layer arrangements, in accordance with the present invention.

FIG. 7 is an exemplary graphical representation illustrating an effect of drift region depletion on drain current, ID, before channel pinch-off is achieved for various devices having different buried layer arrangements. By plotting ID versus $V_{GS}$ for $V_{DS}$=5 volts, this figure further demonstrates the importance of substantially maintaining the desired target conditions of the present invention, at least with respect to channel pinch-off. By way of example only, four exemplary LDMOS devices corresponding to curves A through D in FIG. 7, which may be referred to herein as devices A through D, respectively, each includes a drift region having a doping concentration of 3.2e12 atoms/cm$^2$. Furthermore, device A does not comprise a buried layer at all, while exemplary device B includes a buried layer having a doping concentration of 4.0e12 atoms/cm$^2$, and exemplary device C includes a buried layer having a doping concentration twice that of device B, namely, 8.0e12 atoms/cm$^2$.

Curve A is included merely as an ideal reference curve which illustrates the maximum drain current that can be achieved for this value of doping (e.g., 3.2e12 atoms/cm$^2$) in the drift region. Device B adds a buried layer with Dpock=0.4 μm, as per a preferred embodiment of invention, and device C doubles the buried layer doping dose, as stated above. As apparent from the figure, IMAX for devices B and C are within 20 percent of the maximum attainable for the drift region doping. Device D is the same as the device D shown in FIG. 6, corresponding to the buried layer conditions required to maintain the channel region in the linear mode while a portion of the drift region is depleted for as large a range of $V_{GS}$ as possible. Again, it is clear that IMAX is more than 50 percent lower than the maximum attainable drain current, and thus falls well outside of the desired operating conditions established for the LDMOS device. Therefore, in accordance with another aspect of the invention, the exemplary LDMOS device is preferably configured such that the drift region is not depleted faster than a level which causes IMAX to be less than about 80 percent of a level corresponding to a similar device without a buried layer.

Table 5 below illustrates exemplary simulation results depicting effects of a shallow buried layer, such as, for example, Dpock less than about 0.4 μm (and channel pinch-off), on certain characteristics of the LDMOS device, including IMAX and IB/IS. These exemplary simulation results assume a doping concentration in the drift region of 3.2e12 atoms/cm$^2$, DX equal to zero, and a length of the buried layer Lpock equal to 0.75 μm. It is to be understood, however, that the present invention is not limited to a device having these specific characteristics.

TABLE 5

| DX (μm) | Dpock (μm) | Lpock (μm) | IMAX (mA/mm) | Ron (ohms-mm) | IB/IS | VBD (volts) |
|---|---|---|---|---|---|---|
| 0.0 | 0.4 | 0.75 | 213 | 12.8 | 0.04 | 76 |
| 0.0 | 0.3 | 0.75 | 196 | 13.2 | 0.03 | 76 |
| 0.0 | 0.2 | 0.75 | 157 | 14.2 | 0.03 | 76 |
| 0.0 | 0.1 | 0.75 | 87 | 17.0 | 0.06 | 77 |

Although HCI and breakdown voltage in the device are adequately controlled by the buried layer, when Dpock is less than about 0.3 μm, IMAX is reduced significantly. Thus, as illustrated by Table 2 and 5 above, it is preferred that the buried layer be configured so as to have a vertical spacing between the drift region and the buried layer that is in a range from about 0.2 μm to about 0.5 μm.

Figure 8:
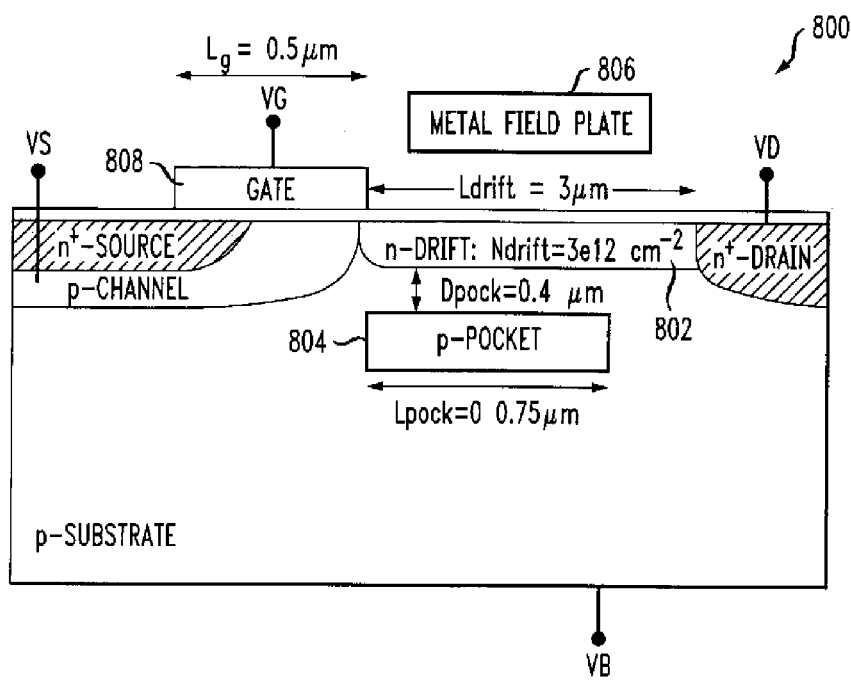
FIG. 8 is a cross-sectional view depicting at least a portion of a semiconductor wafer including an exemplary LDMOS device, formed in accordance with a preferred embodiment of the present invention.

FIG. 8 illustrates a cross-sectional view of at least a portion of a semiconductor wafer comprising an exemplary LDMOS device 800, formed in accordance with a preferred embodiment of the present invention. The exemplary LDMOS 800 is preferably formed in manner similar to the LDMOS device 500 depicted in FIG. 5, comprising a drift region 802 having a doping concentration of about 3.2e12 atoms/cm$^2$, and a buried layer 804 arranged so as to have a vertical spacing, represented by the dimension Dpock, between the drift region and the buried layer equal to about 0.4 μm, to have a horizontal length Lpock of about 0.75 μm, and to be substantially aligned (e.g., DX=0) with an edge of the drift region proximate a gate 808 in the device. The LDMOS device 800 further includes a field plate 806 formed in a manner similar to the field plate shown in FIG. 5.

As will become apparent to those skilled in the art, MOS devices requiring higher values of breakdown voltage will require a longer drift region (increased Ldrift), as measured in a horizontal direction which is substantially parallel to the substrate, and correspondingly lower values for Ron and IMAX for a given doping concentration of the drift region. It is also likely that higher breakdown voltage devices will be required for higher VDC. Alternatively, devices which require lower values of breakdown voltage can accommodate a shorter drift region (decreased Ldrift), and consequently higher IMAX. Table 6 below illustrates exemplary simulation results depicting minimum performance values attainable with the exemplary LDMOS device of the current invention when the doping concentration of the drift region is greater than about 2.0e12 atoms/cm$^2$ for devices designed to accommodate different breakdown voltages VBD. Table 6 also shows the approximate length of the drift region that are required in the exemplary device.

TABLE 6

| VBD (volts) | Approx. Ldrift (μm) | IMAX (mA/mm) | Ron (ohms-mm) |
|---|---|---|---|
| <50 | <3.0 | ≧210 | ≦12 |
| 50–80 | 3.0 | ≧190 | ≦14 |
| >80 | 4.0 | ≧160 | ≦19 |

The exemplary LDMOS device of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide semiconductor (MOS) device, comprising:
   a semiconductor layer of a first conductivity type;
   first and second source/drain regions of a second conductivity type formed in the semiconductor layer proximate an upper surface of the semiconductor layer, the first and second source/drain regions being spaced apart relative to one another;
   a drift region of the second conductivity type formed in the semiconductor layer proximate the upper surface of the semiconductor layer and at least partially between the first and second source/drain regions, the drift region having an impurity doping concentration greater than about 2.0e12 atoms per square centimeter;
   an insulating layer formed on at least a portion of the upper surface of the semiconductor layer;
   a gate formed on the insulating layer at least partially between the first and second source/drain regions; and
   a buried layer of the first conductivity type formed in the semiconductor layer in close relative proximity to and beneath at least a portion of the drift region, at least one of (i) a substantially vertical distance between the buried layer and the drift region and (ii) one or more physical dimensions of the buried layer being configured so as to optimize a power density of the device relative to at least one of an on-resistance and a maximum drain current of the device, the buried layer having an impurity doping concentration greater than about 5e16 atoms per square centimeter.

2. The device of claim 1, further comprising a shielding structure formed proximate the upper surface of the semiconductor layer and at least partially between the gate and the second source/drain region, the shielding structure being electrically connected to the first source/drain region and electrically isolated from the gate.

3. The device of claim 2, wherein the shielding structure is spaced laterally from the gate and is configured in a substantially non-overlapping arrangement relative to the gate.

4. The device of claim 2, wherein the shielding structure is spaced laterally from the gate and is configured to overlap at least an edge of the gate.

5. The device of claim 2, wherein a first portion of the insulating layer under the gate has a different thickness in comparison to a second portion of the insulating layer under the shielding structure.

6. The device of claim 1, wherein the buried layer is configured such that an edge of the buried layer proximate the gate is substantially aligned with an edge of the gate proximate the drift region in at least a substantially vertical direction.

7. The device of claim 1, wherein the buried layer is configured such that an edge of the buried layer proximate the gate is spaced less than about 0.4 micrometers in a substantially horizontal direction from an edge of the gate proximate the drift region.

8. The device of claim 1, wherein the buried layer is arranged, at least in relation to the drift region, such that a maximum drain current in the device is greater than about 190 milliamperes per millimeter, an on-resistance in the device is less than about 15 ohms-millimeters, and an off-state breakdown voltage in the device is greater than about 70 volts.

9. The device of claim 1, wherein the buried layer is arranged, at least in relation to the drift region, such that a maximum drain current in the device is greater than about 210 milliamperes per millimeter and an on-resistance in the device is less than about 12 ohms-millimeters, when an off state breakdown voltage in the device is less than about 50 volts.

10. The device of claim 1, wherein the buried layer is arranged, at least in relation to the drift region, such that a maximum drain current in the device is greater than about 160 milliamperes per millimeter, an on-resistance in the device is less than about 19 ohms-millimeters, and an off-state breakdown voltage in the device is greater than about 80 volts.

11. The device of claim 1, wherein the distance between the buried layer and the drift region is selected such that a channel region, which is formed in the semiconductor layer proximate the upper surface of the semiconductor layer and at least partially between the first source/drain region and the drift region, is substantially pinched-off under on-state operation of the device before the drift region is depleted when an increasing voltage is applied between the second and first source/drain regions.

12. The device of claim 1, wherein the first source/drain region is a source region and the second source/drain region is a drain region.

13. The device of claim 1, wherein the first conductivity type is a p-type conductivity and the second conductivity type is an n-type conductivity.

14. A metal-oxide semiconductor (MOS) device, comprising:
a semiconductor layer of a first conductivity type;
first and second source/drain regions of a second conductivity type formed in the semiconductor layer proximate an upper surface of the semiconductor layer, the first and second source/drain regions being spaced apart relative to one another;
a drift region of the second conductivity type formed in the semiconductor layer proximate the upper surface of the semiconductor layer and at least partially between the first and second source/drain regions, the drift region having an impurity doping concentration greater than about 2.0e12 atoms per square centimeter;
an insulating layer formed on at least a portion of the upper surface of the semiconductor layer;
a gate formed on the insulating layer at least partially between the first and second source/drain regions; and
a buried layer of the first conductivity type formed in the semiconductor layer in close relative proximity to and beneath at least a portion of the drift region, at least one of (i) a substantially vertical distance between the buried layer and the drift region and (ii) one or more physical dimensions of the buried layer being configured so as to optimize a power density of the device relative to at least one of an on-resistance and a maximum drain current of the device;
wherein the buried layer is formed having a length that is less than one half length of the drift region, as measured in a horizontal direction substantially parallel to a plane of the semiconductor layer.

15. The device of claim 14, wherein the buried layer is formed having a length of about 0.75 micrometers and the drift region is formed having a length of about 3.0 micrometers, as measured in a substantially horizontal direction.

16. The device of claim 14, wherein the device is configured so as to provide a maximum drain current measurement of greater than about 190 milliamperes per millimeter and an on-resistance of less than about 15 ohms-millimeter, while maintaining a breakdown voltage of about 80 volts in the device, the maximum drain current measurement being defined as a drain current at which a transconductance of the device reduces to about ten percent of a peak transconductance value as a function of a gate voltage applied to the gate for a desired voltage applied between the drain and source regions.

17. A metal-oxide semiconductor (MOS) device, comprising:
a semiconductor layer of a first conductivity type;
first and second source/drain regions of a second conductivity type formed in the semiconductor layer proximate an upper surface of the semiconductor layer, the first and second source/drain regions being spaced apart relative to one another;
a drift region of the second conductivity type formed in the semiconductor layer proximate the upper surface of the semiconductor layer and at least partially between the first and second source/drain regions, the drift region having an impurity doping concentration greater than about 2.0e12 atoms per square centimeter;
an insulating layer formed on at least a portion of the upper surface of the semiconductor layer;
a gate formed on the insulating layer at least partially between the first and second source/drain regions; and
a buried layer of the first conductivity type formed in the semiconductor layer in close relative proximity to and beneath at least a portion of the drift region, at least one of (i) a substantially vertical distance between the buried layer and the drift region and (ii) one or more physical dimensions of the buried layer being configured so as to optimize a power density of the device relative to at least one of an on-resistance and a maximum drain current of the device;
wherein the distance between the buried layer and the drift region is in a range from about 0.2 micrometers to about 0.6 micrometers.

18. A metal-oxide semiconductor (MOS) device, comprising:
a semiconductor layer of a first conductivity type;
source and drain regions of a second conductivity type formed in the semiconductor layer proximate an upper surface of the semiconductor layer, the source and drain regions being spaced apart relative to one another;
a drift region of the second conductivity type formed in the semiconductor layer proximate the upper surface of the semiconductor layer and at least partially between the source and drain regions, the drift region having an impurity doping concentration greater than about 2.0e12 atoms per square centimeter;
an insulating layer formed on at least a portion of the upper surface of the semiconductor layer;
a gate formed on the insulating layer at least partially between the source and drain regions;
a channel region of the first conductivity type formed in the semiconductor layer proximate the upper surface of the semiconductor layer and at least partially between the source region and the drift region; and
a buried layer of the first conductivity type formed in the semiconductor layer in close relative proximity to and beneath at least a portion of the drift region, the buried layer being configured such that the drift region is not fully depleted before the channel region is pinched-off, whereby a transconductance of the device for an applied drain-to-source voltage greater than a knee voltage associated with the device is within about 20 percent of a peak channel transconductance of the device, the buried layer having an impurity doping concentration greater than about 5e16 atoms per square centimeter.

19. In a metal-oxide semiconductor device comprising a semiconductor layer of a first conductivity type, source and drain regions of a second conductivity type formed in the semiconductor layer proximate an upper surface of the semiconductor layer, the source and drain regions being spaced apart relative to one another, an insulating layer formed on at least a portion of the upper surface of the semiconductor layer, and a gate formed on the insulating layer at least partially between the source and drain regions, a method for optimizing a power density of the device relative to at least one of an on-resistance and a maximum drain current of the device, the method comprising the steps of:
forming a drift region of the second conductivity type formed in the semiconductor layer proximate the upper surface of the semiconductor layer and at least partially between the first and second source/drain regions, the drift region having an impurity doping concentration greater than about 2.0e12 atoms per square centimeter;

forming a buried layer of the first conductivity type formed in the semiconductor layer in close relative proximity to and beneath at least a portion of the drift region, the buried layer having an impurity doping concentration greater than about 5e16 atoms per square centimeter;

adjusting an arrangement of the buried layer, at least in relation to the drift region, by controlling at least one of: (i) a substantially vertical distance between the buried layer and the drift region; and (ii) one or more physical dimensions of the buried layer.

20. An integrated circuit including at least one metal-oxide semiconductor device, the device comprising:

a semiconductor layer of a first conductivity type;

first and second source/drain regions of a second conductivity type formed in the semiconductor layer proximate an upper surface of the semiconductor layer, the first and second source/drain regions being spaced apart relative to one another;

a drift region of the second conductivity type formed in the semiconductor layer proximate the upper surface of the semiconductor layer and at least partially between the first and second source/drain regions, the drift region having an impurity doping concentration greater than about 2.0e12 atoms per square centimeter;

an insulating layer formed on at least a portion of the upper surface of the semiconductor layer;

a gate formed on the insulating layer at least partially between the first and second source/drain regions; and a buried layer of the first conductivity type formed in the semiconductor layer in close relative proximity to and beneath at least a portion of the drift region, at least one of (i) a substantially vertical distance between the buried layer and the drift region and (ii) one or more physical dimensions of the buried layer being configured so as to optimize a power density of the device relative to at least one of an on-resistance and a maximum drain current of the device, the buried layer having an impurity doping concentration greater than about 5e16 atoms per square centimeter.

* * * * *